(12) United States Patent
Yu

(10) Patent No.: US 11,751,334 B2
(45) Date of Patent: Sep. 5, 2023

(54) SEMICONDUCTOR DEVICE WITH INTERFACE STRUCTURE AND METHOD FOR FABRICATING THE SAME

(71) Applicant: NANYA TECHNOLOGY CORPORATION, New Taipei City (TW)

(72) Inventor: Chun-Huang Yu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 0 days.

(21) Appl. No.: 17/508,966

(22) Filed: Oct. 22, 2021

(65) Prior Publication Data

US 2023/0130078 A1   Apr. 27, 2023

(51) Int. Cl.
| | |
|---|---|
| *H05K 1/11* | (2006.01) |
| *H05K 1/18* | (2006.01) |
| *H05K 3/00* | (2006.01) |
| *H05K 3/40* | (2006.01) |
| *H01L 23/00* | (2006.01) |

(52) U.S. Cl.
CPC ............ *H05K 1/181* (2013.01); *H05K 1/115* (2013.01); *H05K 3/0011* (2013.01); *H05K 3/40* (2013.01); *H01L 24/73* (2013.01); *H01L 2224/73265* (2013.01); *H05K 2201/10189* (2013.01); *H05K 2201/10378* (2013.01)

(58) Field of Classification Search
CPC ....... H05K 1/181; H05K 1/115; H05K 3/0011; H05K 3/40; H01L 24/73; H01L 2224/73265; H05K 2201/10189; H05K 2201/10378; H01L 23/49816; H01L 21/481; H05K 3/3452; H01L 24/16; H01L 2224/131; H01L 2224/16225; H01L 2224/16227; H01L 2224/81191; H01L 2924/01327; H01L 2924/14; H01L 2924/15311; H05K 2201/0191; H05K 2201/10674; Y10T 428/24331

See application file for complete search history.

(56) References Cited

U.S. PATENT DOCUMENTS

| | | | |
|---|---|---|---|
| 2003/0146510 A1* | 8/2003 | Chien .................. | H05K 3/3436 257/738 |
| 2004/0212389 A1* | 10/2004 | Hamren et al. ....... | G01R 1/0433 324/750.16 |
| 2007/0269999 A1* | 11/2007 | Di Stefano ........ | G01R 1/06738 439/73 |
| 2009/0174081 A1* | 7/2009 | Furuta .................... | H05K 1/186 257/E23.141 |
| 2011/0195223 A1* | 8/2011 | Bchir et al. .......... | H05K 3/3452 428/138 |
| 2013/0120018 A1* | 5/2013 | Hou et al. .............. | H05K 1/115 257/737 |

(Continued)

FOREIGN PATENT DOCUMENTS

| | | |
|---|---|---|
| CN | 102012470 A | 4/2011 |
| CN | 102095946 A | 6/2011 |

(Continued)

OTHER PUBLICATIONS

Office Action with the search report mailed on Jan. 16, 2023 related to Taiwanese Application No. 111108398.

*Primary Examiner* — Steven T Sawyer
(74) *Attorney, Agent, or Firm* — Xuan Zhang

(57) ABSTRACT

The present application discloses a semiconductor device with an interface structure and a method for fabricating the interface structure. The interface structure includes an interface board configured to be fixed onto and electrically coupled to a chuck of a testing equipment, and a first object positioned on a first surface of the interface board and electrically coupled to the interface board. The first object is configured to be analyzed by the testing equipment.

16 Claims, 15 Drawing Sheets

(56) References Cited

U.S. PATENT DOCUMENTS

| | | | |
|---|---|---|---|
| 2017/0139004 A1 | 5/2017 | Jun et al. | |
| 2017/0186677 A1* | 6/2017 | Imafuji et al. | H01L 21/4853 |
| 2017/0280560 A1* | 9/2017 | Park | H01L 24/00 |
| 2018/0164343 A1 | 6/2018 | Wang et al. | |
| 2019/0259743 A1* | 8/2019 | Han | H01L 25/50 |
| 2021/0366889 A1* | 11/2021 | Lin et al. | H01L 23/49816 |

FOREIGN PATENT DOCUMENTS

CN            106449525    A     2/2017

\* cited by examiner

SEMICONDUCTOR DEVICE WITH INTERFACE STRUCTURE AND METHOD FOR FABRICATING THE SAME

TECHNICAL FIELD

The present disclosure relates to a semiconductor device and a method for fabricating the same, and more particularly, to a semiconductor device with an interface structure and a method for fabricating the same.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. Accordingly, a variety of issues arise during the scaling-down process, and such issues are continuously increasing. The semiconductor device need to be tested (or analyzed) several times during fabrication so as to ensure the quality thereof. The configuration of the semiconductor device to be test still need to be improved.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an interface structure including an interface board configured to be fixed onto and electrically coupled to a chuck of a testing equipment, and a first object positioned on a first surface of the interface board and electrically coupled to the interface board. The first object is configured to be analyzed by the testing equipment.

In some embodiments, the interface structure includes a fixing unit positioned along the interface board and extending to the chuck to fix the interface board onto the chuck.

In some embodiments, the fixing unit is a screw.

In some embodiments, the interface structure includes a lower connector positioned on a second surface of the interface board. The second surface is opposite to the first surface and is faced toward the chuck.

In some embodiments, the lower connector and the chuck are electrically coupled through a chuck connector.

In some embodiments, the chuck connector is a pogo pin.

In some embodiments, the chuck connector is a conductive polymer.

In some embodiments, the interface board includes a test pattern configured to electrically couple the first object and the lower connector.

In some embodiments, the test pattern includes at least one through board via positioned along the interface board and contacts the lower connector.

In some embodiments, the first object includes a package substrate positioned on the first surface of the interface board and electrically connected to the interface board, a first semiconductor die positioned on the package substrate, and a wire configured to electrically couple the first semiconductor die and the package substrate.

In some embodiments, the package substrate and the interface board are electrically coupled through an upper connector.

In some embodiments, the upper connector is a solder ball.

In some embodiments, the interface structure includes a second semiconductor die positioned on the package substrate, next to the first semiconductor die, and electrically coupled to the package substrate.

In some embodiments, the first semiconductor die and the second semiconductor die have a same layout.

In some embodiments, a thickness of the interface board is greater than a thickness of the package substrate.

Another aspect of the present disclosure provides an interface structure including an interface board configured to fix onto and electrically coupled to a chuck of a testing equipment, an upper connector positioned on a first surface and electrically coupled to the interface board, a lower connector positioned on a second surface and electrically coupled to the interface board, and a through board via positioned in the interface board and configured to electrically couple the upper connector and the lower connector. The first surface of the interface board is opposite to the second surface of the interface board.

In some embodiments, the interface structure includes a first object is positioned on the upper connector and is electrically coupled to the upper connector. The first object includes a first semiconductor die.

Another aspect of the present disclosure provides a method for fabricating an interface structure including providing an interface board, forming a through board via along the interface board, forming a through board opening along the interface board, forming an upper connector on a first surface of the interface board, and forming a lower connector on a second surface of the interface board.

In some embodiments, the upper connector is a solder ball.

In some embodiments, the interface board includes an epoxy based material, or bismaleimide triazine.

Due to the design of the interface structure of the present disclosure, the internal signal of an object to be tested may be detected and failure mode and effects analysis in high frequency can be conducted.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
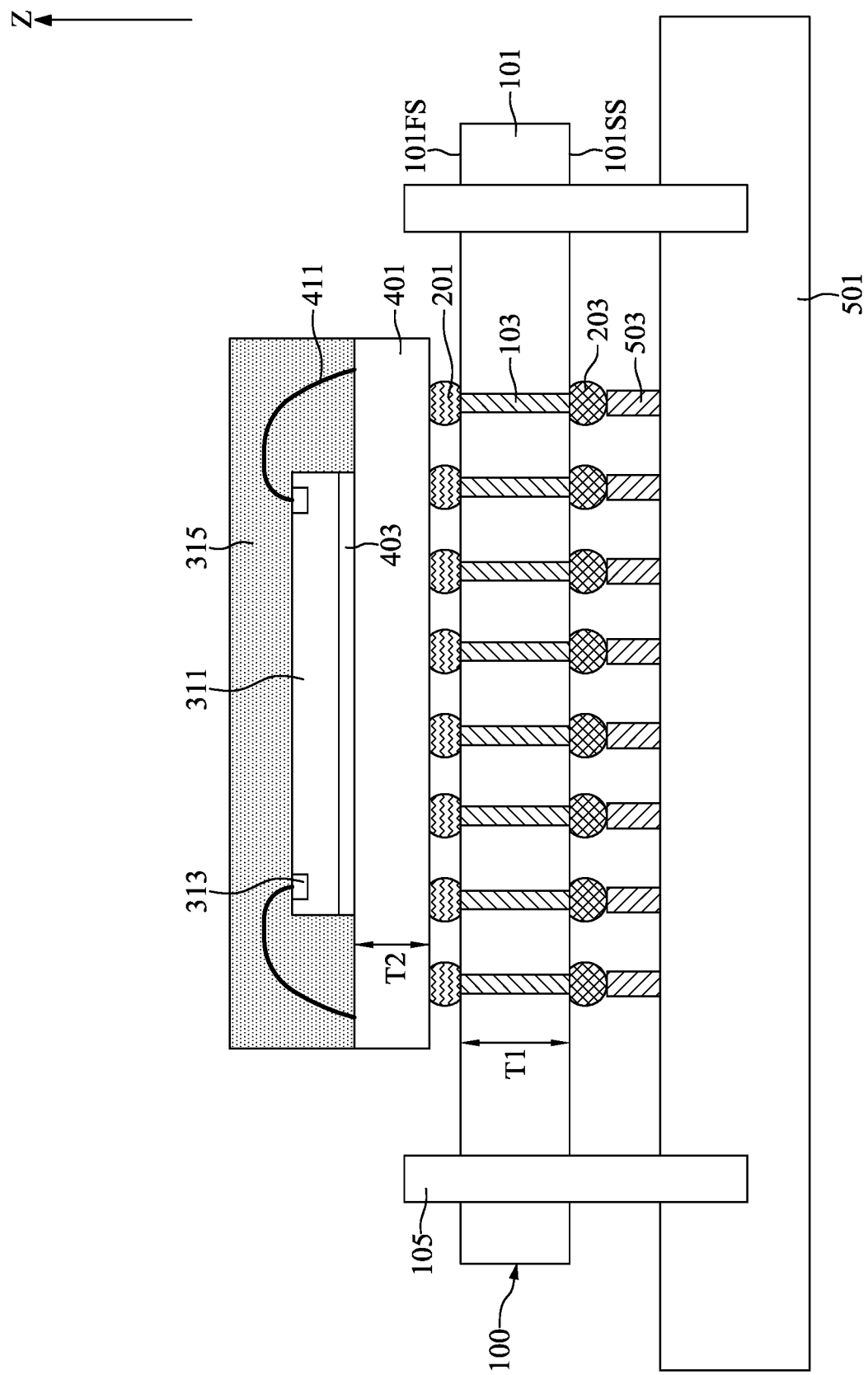
FIG. 1 illustrates, in a schematic cross-sectional view diagram, an interface structure in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the description of the present disclosure, an X-Y-Z coordinate system is assumed where X and Y refer to dimensions within the plane parallel to the major surface of the structure and Z refers a dimension perpendicular to the plane, two features are topographically aligned when those features have substantially the same X, Y coordinates.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

Figure 2:
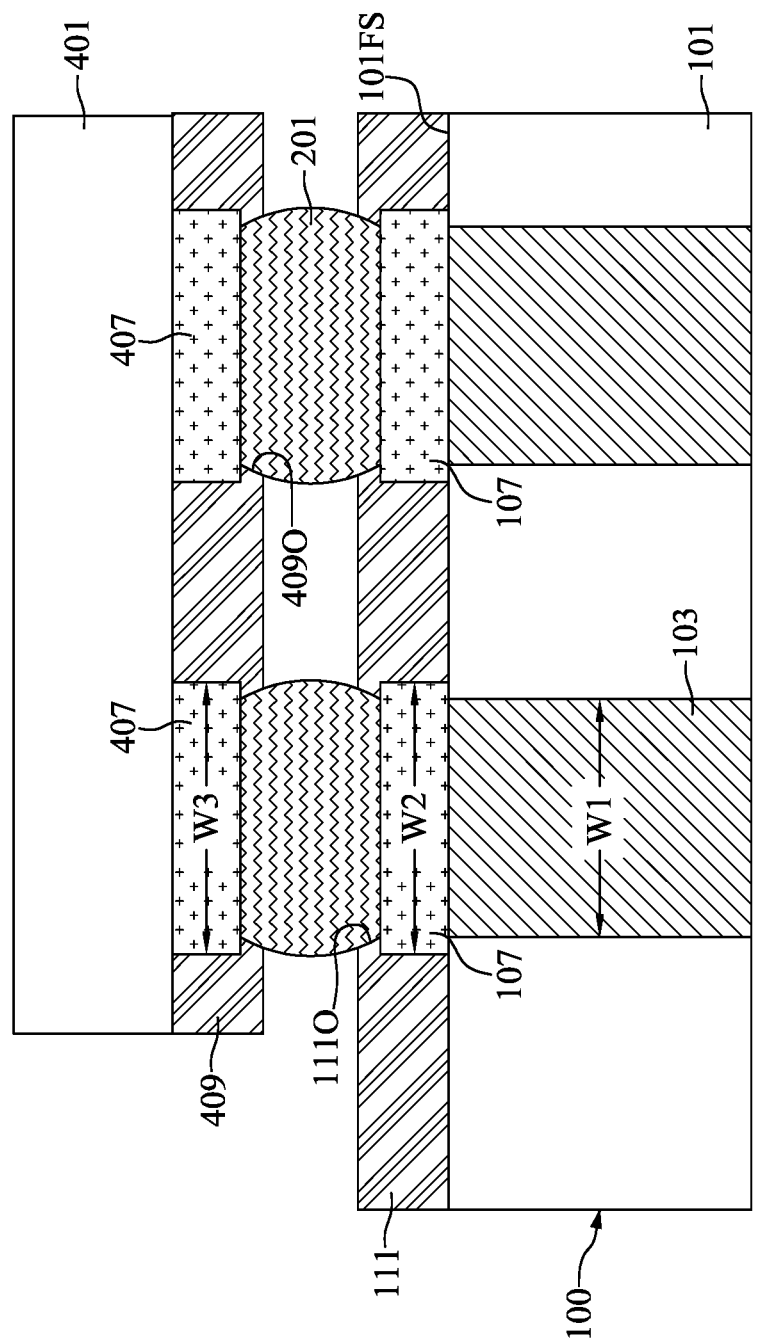
FIGS. 2 and 3 illustrate, in schematic close-up cross-sectional view diagrams, parts of the interface structure in accordance with one embodiment of the present disclosure.
Figure 3:
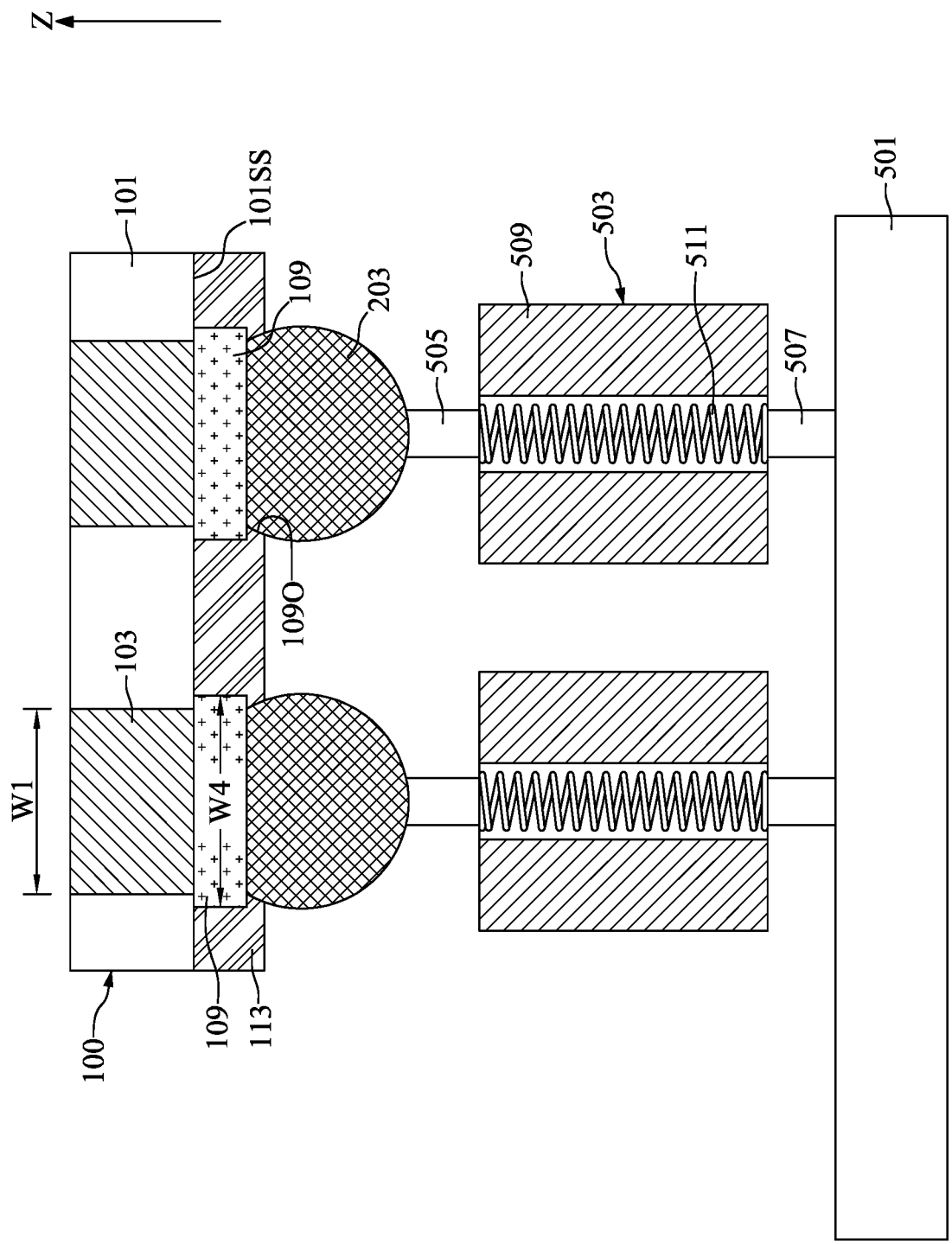

FIG. 1 illustrates, in a schematic cross-sectional view diagram, an interface structure 100 in accordance with one embodiment of the present disclosure. FIGS. 2 and 3 illustrate, in schematic close-up cross-sectional view diagrams, parts of the interface structure 100 in accordance with one embodiment of the present disclosure. It should be noted that some elements are omitted in the close-up cross-sectional view diagrams for clarity.

With reference to FIG. 1, an interface board 101 may be provided and may include an epoxy based material or bis-maleimide triazine. In some embodiments, the interface board 101 may be a laminate sheet but is not limited thereto. In some embodiments, the interface board 101 may be a printed circuit board. In some embodiments, the interface board 101 may have a thickness T1 between about 0.8 mm and about 1.2 mm. The interface board 101 may include a first surface 101FS and a second surface 101SS parallel to each other. In the present embodiment, the first surface 101FS may be faced upward and the second surface 101SS may be faced downward.

With reference to FIG. 1, a plurality of through board vias 103 may be disposed in the interface board 101. For brevity, clarity, and convenience of description, only one through board via 103 is described. In some embodiments, the through board via 103 may be disposed along the interface board 101. That is, the top surface of the through board via 103 may be substantially coplanar with the first surface 101FS. The bottom surface of the through board via 103 may be substantially coplanar with the second surface 101SS. In some embodiments, the through board via 103 may be disposed in the interface board 101 and between the first surface 101FS and the second surface 101SS. In other words, the top surface of the through board via 103 may not be substantially coplanar with the first surface 101FS. The bottom surface of the through board via 103 may not be substantially coplanar with the second surface 101SS. In some embodiments, the through board via 103 may be formed of, for example, copper, aluminum, or other suitable metal or metal alloy. In some embodiments, the plurality of through board vias 103 may configure a test pattern. The test pattern may be designated according to an object to be tested.

With reference to FIG. 1, the interface board 101 may be configured to be fixed onto a chuck 501 of a test equipment. In some embodiments, the test equipment may be an auto test equipment including a probe card. The interface board 101 may be fixed onto the chuck 501 through a plurality of fixing units 105. For brevity, clarity, and convenience of description, only one fixing unit 105 is described. The fixing unit 105 may be disposed along the interface board 101 and extending to the chuck 501. In some embodiments, the fixing unit 105 may be a screw.

With reference to FIG. 1, a plurality of upper connectors 201 may be disposed on the first surface 101FS of the interface board 101. In some embodiments, the plurality of upper connectors 201 may include lead, tin, indium, bismuth, antimony, silver, gold, copper, nickel, or alloy thereof. In some embodiments, the plurality of upper connectors 201 may be solder balls.

With reference to FIG. 1, a plurality of lower connectors 203 may be disposed on the second surface 101SS of the interface board 101. In some embodiments, the plurality of lower connectors 203 may include lead, tin, indium, bismuth, antimony, silver, gold, copper, nickel, or alloy thereof. In some embodiments, the plurality of lower connectors 203 may be solder balls. In some embodiments, the plurality of lower connectors 203 may be pogo pins. The shape of the lower pins of the plurality of lower connectors 203 may be crown, pyramid crown, serrated, cup, conical, sphere, flat, half moon, or blade.

In some embodiments, the interface board 101, the plurality of through board vias 103, and the plurality of lower connectors 203 together configure the interface structure 100. In some embodiments, the interface structure 100 may include the plurality of upper connectors 201.

In some embodiments, a first object may be disposed on the interface structure 100 and may be electrically coupled to the interface structure 100. The first object may be tested by the test equipment. In some embodiments, the first object being tested may be, for example, a semiconductor device such as a semiconductor chip. The semiconductor chip may be part of a wafer. Furthermore, the semiconductor chip may be part of a stack of chips being tested.

With reference to FIG. 1, the first object may include a first semiconductor die 311, a plurality of first bonding pads 313, a molding layer 315, a package substrate 401, a first attachment layer 403, and a plurality of wires 411. The package substrate 401 may be disposed on the plurality of upper connectors 201 and may be electrically connected to the plurality of upper connectors 201. In some embodiments, the package substrate 401 may be a laminate sheet but is not limited thereto. In some embodiments, the package substrate 401 may include an epoxy based material or bismaleimide triazine. In some embodiments, the package substrate 401 may be a printed circuit board. In some embodiments, the package substrate 401 may have a thickness T2 less than the thickness T1 of the interface board 101.

With reference to FIG. 1, the first semiconductor die 311 may be disposed on the package substrate 401 with the first attachment layer 403 interposed therebetween. The first semiconductor die 311 may include a substrate and a circuit layer (the substrate and the circuit layer are not respectively shown for clarity). The substrate of the first semiconductor die 311 may be disposed on the first attachment layer 403. The substrate of the first semiconductor die 311 may be formed of, for example, a bulk semiconductor substrate that is composed entirely of at least one semiconductor material. The semiconductor material may include any material, or stack of materials, having semiconducting properties including, but not limited to, silicon, germanium, silicon germanium alloys, III-V compound semiconductors, or II-VI compound semiconductors.

The circuit layer of the first semiconductor die 311 may be disposed on the substrate of the first semiconductor die 311. The circuit layer may include inter-layer dielectric layers and/or inter-metal dielectric layers containing a plurality of functional blocks (not shown for clarity) and a plurality of conductive features (not shown for clarity). The plurality of functional blocks may be transistors such as complementary metal-oxide-semiconductor transistors, metal-oxide-semiconductor field-effect transistors, fin field-effect-transistors, the like, or a combination thereof. The plurality of functional blocks may cooperate together and provide a variety of functionalities such as logic, I/O, memory, analog circuits, and the like. The cooperation of the plurality of functional blocks may be achieved by the plurality of conductive features. In the present disclosure, the configuration of the plurality of functional blocks and the plurality of conductive features may be referred to as the layout of the first semiconductor die 311.

The plurality of conductive features may include a plurality of conductive plugs, a plurality of conductive lines, a plurality of conductive vias, and a plurality of conductive pads, or other suitable conductive elements. The plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The inter-layer dielectric layers and/or the inter-metal dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0.

With reference to FIG. 1, the first attachment layer 403 may be die attach film, silver paste, or the like. In some embodiments, the first attachment layer 403 may further include gold, silver, alumina, or boron nitride particles.

With reference to FIG. 1, the plurality of first bonding pads 313 may be disposed in the first semiconductor die 311. The top surfaces of the plurality of first bonding pads 313 may be substantially coplanar with the top surface of the first semiconductor die 311. Specifically, the plurality of first bonding pads 313 may be disposed in the circuit layer of the first semiconductor die 311. The top surfaces of the plurality of first bonding pads 313 may be substantially coplanar with the top surface of the circuit layer of the first semiconductor die 311. The plurality of first bonding pads 313 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 1, the plurality of wires 411 may electrically connect the plurality of first bonding pads 313 to the package substrate 401, respectively. The plurality of wires 411 may be formed of, for example, gold.

With reference to FIG. 1, the molding layer 315 may be disposed on the package substrate 401 to cover the first semiconductor die 311, the plurality of first bonding pads 313, the first attachment layer 403, the plurality of wires 411, and the top surface of the package substrate 401. The molding layer 315 may include polybenzoxazole, polyimide, benzocyclobutene, epoxy laminate, or ammonium bifluoride.

With reference to FIG. 1, the interface board 101 and the chuck 501 of the test equipment may be electrically coupled through a plurality of chuck connectors 503. For brevity, clarity, and convenience of description, only one chuck connector 503 is described. In some embodiments, the chuck connector 503 may be a conductive polymer such as conductive rubber. In some embodiments, the chuck connector 503 may be a pogo pin.

With reference to FIGS. 1 and 2, specifically, a plurality of first board pads 107 may be disposed on the first surface 101FS of the interface board 101. For brevity, clarity, and convenience of description, only one first board pad 107 is described. The first board pad 107 may be disposed between the through board via 103 and the upper connector 201. The first board pad 107 may electrically couple the through board via 103 and the upper connector 201. In some embodiments, the width W2 of the first board pad 107 may be less than or equal to the width W1 of the through board via 103. The first board pad 107 may be formed of, for example, copper or other suitable metal or metal alloy.

With reference to FIGS. 1 and 2, a first resist layer 111 may be disposed on the first surface 101FS of the interface board 101. The first resist layer 111 may include a plurality of openings 111O to expose the plurality of first board pads 107. In some embodiments, the plurality of first board pads 107 are solder-mask-defined pads, the plurality of openings 111O of the first resist layer 111 are smaller than the plurality of first board pads 107 in size to cover the peripheries of the plurality of first board pads 107. The first resist layer 111 may be include polybenzoxazole, polyimide, benzocyclobutene, epoxy laminate, or ammonium bifluoride.

With reference to FIGS. 1 and 2, a plurality of ball pads 407 may be disposed on the bottom surface of the package substrate 401. For brevity, clarity, and convenience of description, only one ball pad 407 is described. The ball pad 407 may be disposed between the package substrate 401 and the upper connector 201. The ball pad 407 may electrically couple the package substrate 401 and the upper connector 201. In some embodiments, the width W3 of the ball pad 407 may be the same as the width W1 of the first board pad 107 but is not limited thereto. The ball pad 407 may be formed of, for example, copper or other suitable metal or metal alloy.

With reference to FIGS. 1 and 2, a third resist layer 409 may be disposed on the bottom surface of the package substrate 401. The third resist layer 409 may include a plurality of openings 409O to expose the plurality of ball pads 407. In some embodiments, the plurality of ball pads 407 are solder-mask-defined pads, the plurality of openings 409O of the third resist layer 409 are smaller than the plurality of ball pads 407 in size to cover the peripheries of the plurality of ball pads 407. The third resist layer 409 may be include polybenzoxazole, polyimide, benzocyclobutene, epoxy laminate, or ammonium bifluoride.

With reference to FIGS. 1 to 3, a plurality of second board pads 109 may be disposed on the second surface 101SS of the interface board 101. For brevity, clarity, and convenience of description, only second board pad 109 is described. The second board pad 109 may be disposed between the through board via 103 and the lower connector 203. The second board pad 109 may electrically couple the through board via 103 and the lower connector 203. In some embodiments, the width W4 of the second board pad 109 may be less than or equal to the width W1 of the through board via 103. The second board pad 109 may be formed of, for example, copper or other suitable metal or metal alloy.

With reference to FIGS. 1 to 3, a second resist layer 113 may be disposed on the second surface 101SS of the interface board 101. The second resist layer 113 may include a plurality of openings 113O to expose the plurality of second board pads 109. In some embodiments, the plurality of second board pads 109 are solder-mask-defined pads, the plurality of openings 113O of the second resist layer 113 are smaller than the plurality of second board pads 109 in size to cover the peripheries of the plurality of second board pads 109. The second resist layer 113 may be include polybenzoxazole, polyimide, benzocyclobutene, epoxy laminate, or ammonium bifluoride.

With reference to FIGS. 1 to 3, while the chuck connector 503 is a pogo pin, the chuck connector 503 may include a top connection pin 505, a bottom connection pin 507, a housing 509, and a resilient connecting unit 511. The housing 509 may be disposed between the lower connector 203 and the chuck 501. In some embodiments, the housing 509 may have a hollow cylindrical shape. In some embodiments, the housing 509 may be formed of, for example an insulating material. The pogo pin may include spring or spring-like mechanism that cause the contact between the chuck 501 and the lower connector 203 to be less stressing on the lower connector 203.

With reference to FIGS. 1 to 3, the top connection pin 505 may be disposed between the lower connector 203 and the housing 509. The top connection pin 505 may have an upper end configured to make contact with the lower connector 203, and a lower end connected to the upper surface of the housing 509. In some embodiments, the upper end of the top connection pin 505 may have a shape such as crown, pyramid crown, serrated, cup, conical, sphere, flat, half moon, or blade.

With reference to FIGS. 1 to 3, the bottom connection pin 507 may be disposed between the chuck 501 of the test equipment and the housing 509. The bottom connection pin 507 may have a lower end configured to make contact with the chuck 501 of the test equipment, and an upper end connected to the lower surface of the housing 509. In some embodiments, the lower end of the bottom connection pin 507 may have a shape such as crown, pyramid crown, serrated, cup, conical, sphere, flat, half moon, or blade.

With reference to FIGS. 1 to 3, the resilient connecting unit 511 may be disposed in the housing 509. The resilient connecting unit 511 may be physically and electrically connected between the top connection pin 505 and the bottom connection pin 507. In some embodiments, the resilient connecting unit 511 may be a spring such as a tensile spring. The resilient connecting unit 511 may provide as a shock absorber to reduce the stress on the lower connector 203, and as a means for ensuring that the lower connector 203 are contacted with the chuck connector 503.

Conventionally, during analyzing a semiconductor device, a board is fixed onto a test equipment and a die is attached on the lower surface, which is faced the test equipment, of the board. Due to the configuration of the board and the die, the die is obscured by the board. As a result, probes of a probe card can not directly contact the die to analyze internal signal of the die.

In contrast, in the present disclosure, the present of the interface structure 100 make an object to be tested (e.g., the first semiconductor die 311) can be completely exposed so as to probes can directly contact the object to be tested to analyze internal signal of the die. In addition, the interface structure 100 and the chuck 501 of the test equipment are electrically coupled only through the lower connector 203 and the chuck connector 503 instead of a long cable. Therefore, the shorter connection between the object to be tested and the test equipment make the first semiconductor die 311 can be analyzed in high frequency situation. Furthermore, the chuck connector 503 contact the lower connector 203 of the interface structure 100 instead of directly contacting the first semiconductor die 311 or the package substrate 401. Hence, the chance of damaging the object to be tested by the chuck connector 503 during setting the object to the test equipment may be avoided or alleviated.

Figure 4:
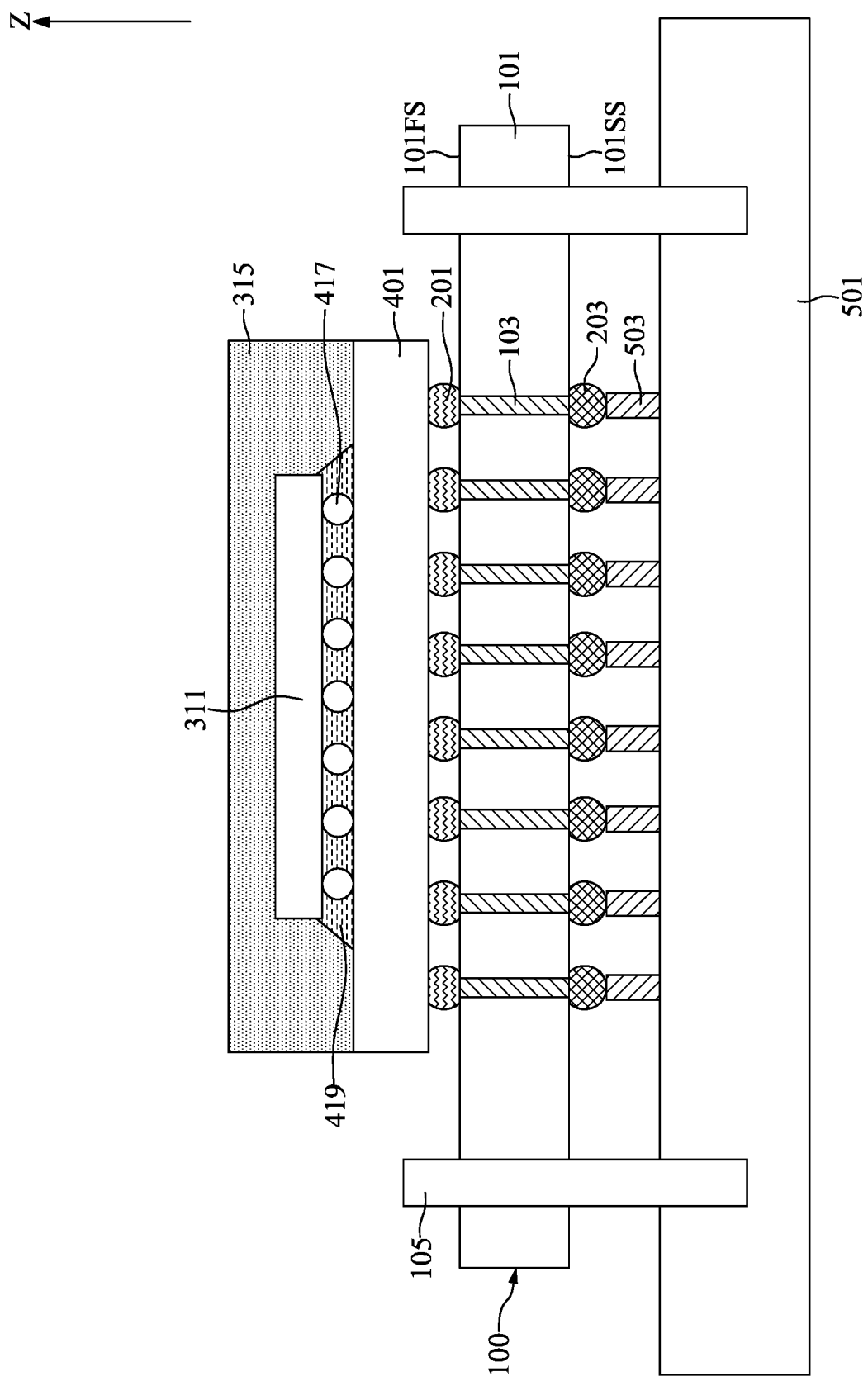
FIG. 4 illustrates, in a schematic cross-sectional view diagram, another embodiment of the present disclosure.
Figure 5:
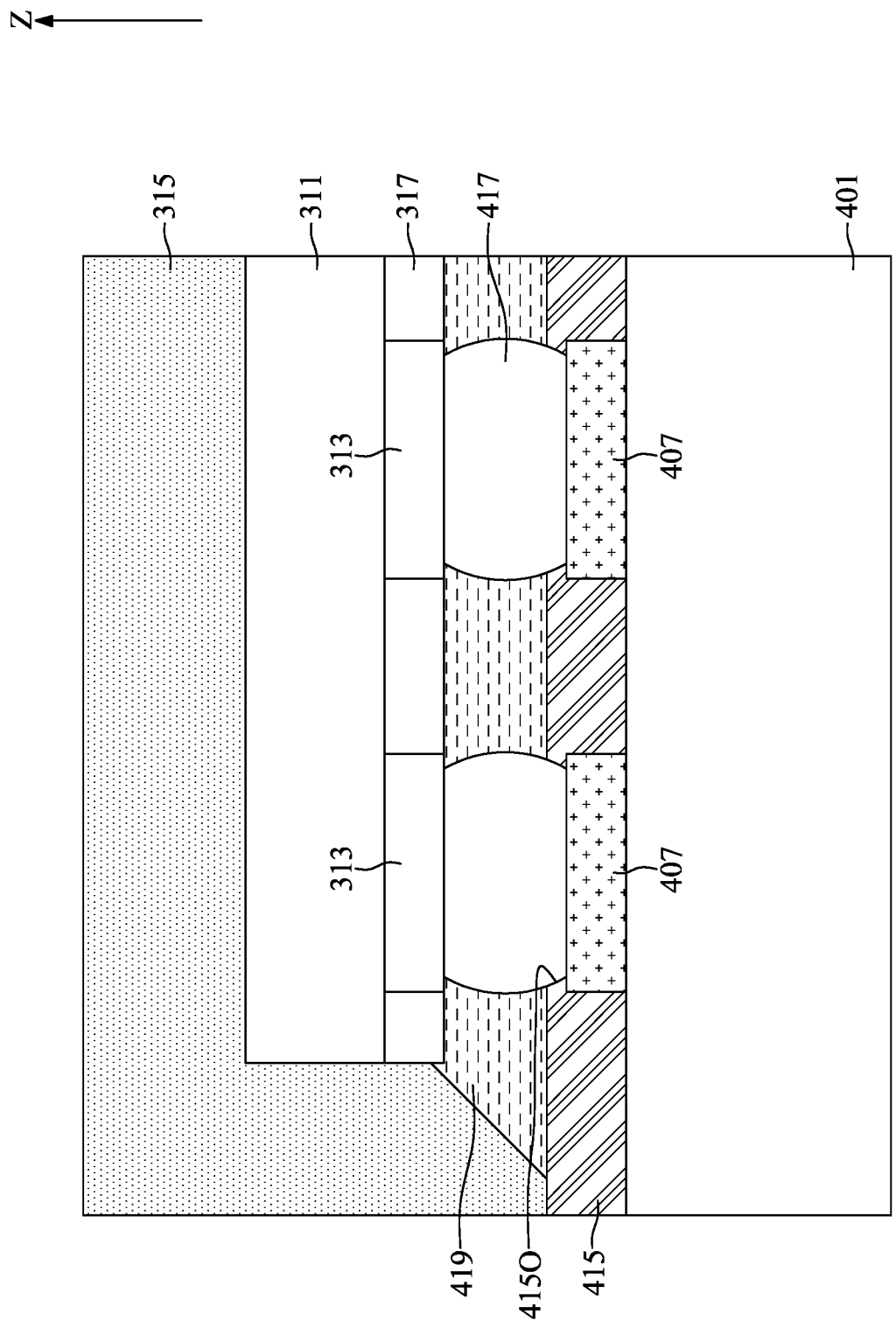
FIG. 5 illustrates, in a schematic close-up cross-sectional view diagram, another embodiment of the present disclosure.

FIG. 4 illustrates, in a schematic cross-sectional view diagram, another embodiment of the present disclosure. FIG. 5 illustrates, in a schematic close-up cross-sectional view diagram, another embodiment of the present disclosure. The same or similar elements in FIG. 4 as in FIG. 1 have been marked with similar reference numbers and duplicative descriptions have been omitted. It should be noted that some elements are omitted in the close-up cross-sectional view diagram for clarity.

With reference to FIG. 4, the first semiconductor die 311 may be bonded onto the package substrate 401 through a plurality of bumps 417 by a flip chip bonding process. For brevity, clarity, and convenience of description, only one bump 417 is described. The bump 417 is disposed between the package substrate 401 and the first semiconductor die 311. In some embodiments, the bump 417 may include lead, tin, indium, bismuth, antimony, silver, gold, copper, nickel, or alloy thereof.

An underfill layer 419 may be disposed between the package substrate 401 and the first semiconductor die 311 to fill the space between the first semiconductor die 311 and the package substrate 401. The underfill layer 419 may surround the plurality of bumps 417. In some embodiments, the underfill layer 419 may be from by curing an underfill material which is made up of a cross-linked organic resin and low Coefficient of Thermal Expansion (CTE) inorganic particles (up to 75 wt.%). In some embodiments, the underfill material before curing may be formulated with a liquid resin such as epoxies, a hardener such as anhydride or amines, an elastomer for toughening, a catalyst for promoting cross-linking, and other additives for flow modification and adhesion.

The underfill layer 419 may tightly adhere to the first semiconductor die 311, the plurality of bumps 417, and the package substrate 401 so as to the underfill layer 419 may redistribute the stresses and strains from the CTE mismatch and mechanical shock over the entire die area of the first semiconductor die 311. As a result, crack initiation and growth in the bump 417 may be either prevented or drastically reduced. In addition, the underfill layer 419 may provide protection to the plurality of bumps 417 to improve mechanical integrity of the configuration of the first semiconductor die 311 and the package substrate 401; therefore, the overall reliability of the configuration of the first semiconductor die 311 and the package substrate 401 may also be significantly improved. Furthermore, the underfill layer 419 may provide partial protection against moisture ingress, and other forms of contamination.

With reference to FIG. 4, the molding layer 315 may cover the first semiconductor die 311, the underfill layer 419, and the top surface of the package substrate 401.

With reference to FIGS. 4 and 5, specifically, the plurality of ball pads 407 may be also disposed on the top surface of the package substrate 401. The ball pad 407 may be disposed between the package substrate 401 and the bump 417. The ball pad 407 may electrically couple the package substrate 401 and the first semiconductor die 311. A fourth resist layer 415 may be disposed on the top surface of the package substrate 401. The fourth resist layer 415 may include a plurality of openings 415O to expose the plurality of ball pads 407 disposed on the top surface of the package substrate 401. In some embodiments, the plurality of ball pads 407 disposed on the top surface of the package substrate 401 are solder-mask-defined pads, the plurality of openings 415O of the fourth resist layer 415 are smaller than the plurality of ball pads 407 in size to cover the peripheries of the plurality of ball pads 407. The fourth resist layer 415 may be include polybenzoxazole, polyimide, benzocyclobutene, epoxy laminate, or ammonium bifluoride.

With reference to FIGS. 4 and 5, specifically, the lower most portion of the first semiconductor die 311 may be a passivation layer 317. In some embodiments, the passivation layer 317 may include polybenzoxazole, polyimide, benzocyclobutene, ajinomoto buildup film, solder resist film, the like, or a combination thereof. The passivation layer 317 formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In some other embodiments, the passivation layer 317 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 4 and 5, specifically, a plurality of first bonding pads 313 may be disposed in the passivation layer 317. For brevity, clarity, and convenience of description, only one first bonding pad 313 is described. The first bonding pad 313 may be disposed on the bump 417 and electrically connected to the bump 417. The first bonding pads 313 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 6:
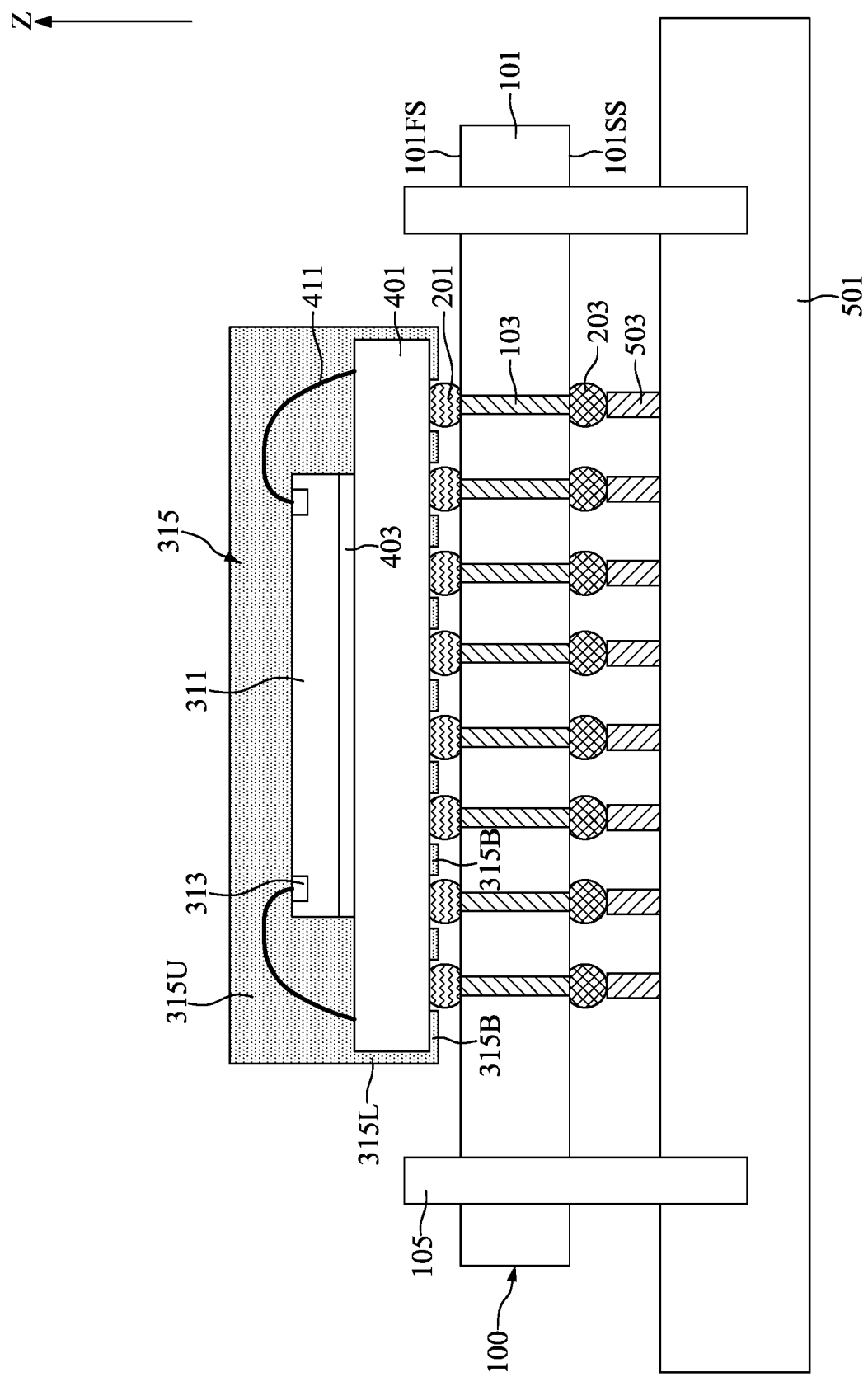
FIG. 6 illustrates, in a schematic cross-sectional view diagram, another embodiment of the present disclosure.
Figure 7:
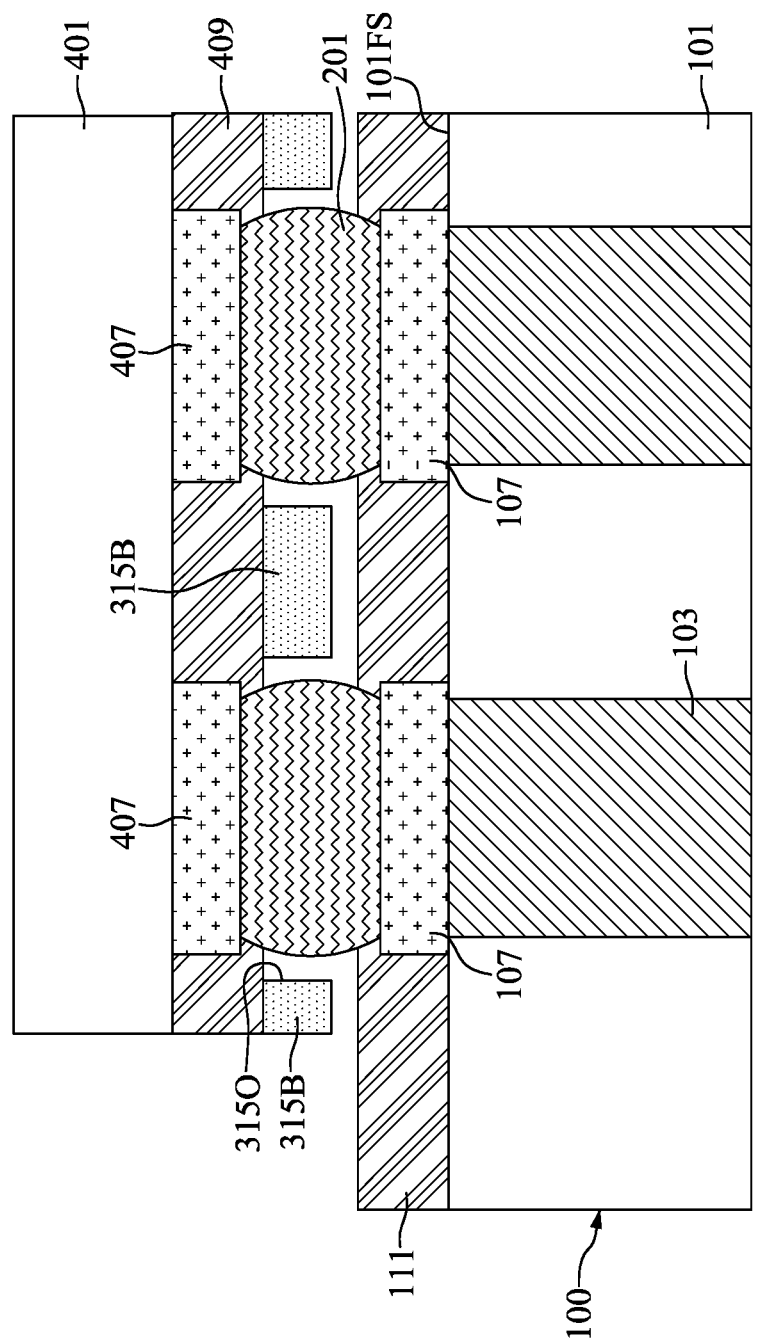
FIG. 7 illustrates, in a schematic close-up cross-sectional view diagram, another embodiment of the present disclosure.

FIG. 6 illustrates, in a schematic cross-sectional view diagram, another embodiment of the present disclosure. FIG. 7 illustrates, in a schematic close-up cross-sectional view diagram, another embodiment of the present disclosure. The same or similar elements in FIG. 6 as in FIG. 1 have been marked with similar reference numbers and duplicative descriptions have been omitted. It should be noted that some elements are omitted in the close-up cross-sectional view diagram for clarity.

With reference to FIGS. 6 and 7, the molding layer 315 may include a bottom portion 315B, an upper portion 315U, and a lateral portion 315L. The upper portion 315U may be disposed on the top surface of the package substrate 401 and may cover the first semiconductor die 311, the plurality of first bonding pads 313, and the plurality of wires 411. The bottom portion 315B may be thicker than the third resist layer 409 in thickness and may cover on the third resist layer 409 to prevent moisture invasion from the bottom surface of the package substrate 401. Also, the plurality of upper connectors 201 may not directly contact the opening 315O of the bottom portion 315B to avoid contact stress. The lateral portion 315L may be disposed on sidewall of the package substrate 401 and may integrally connect the upper portion 315U and the bottom portion 315B thereby preventing moisture invasion from lateral direction.

Figure 8:
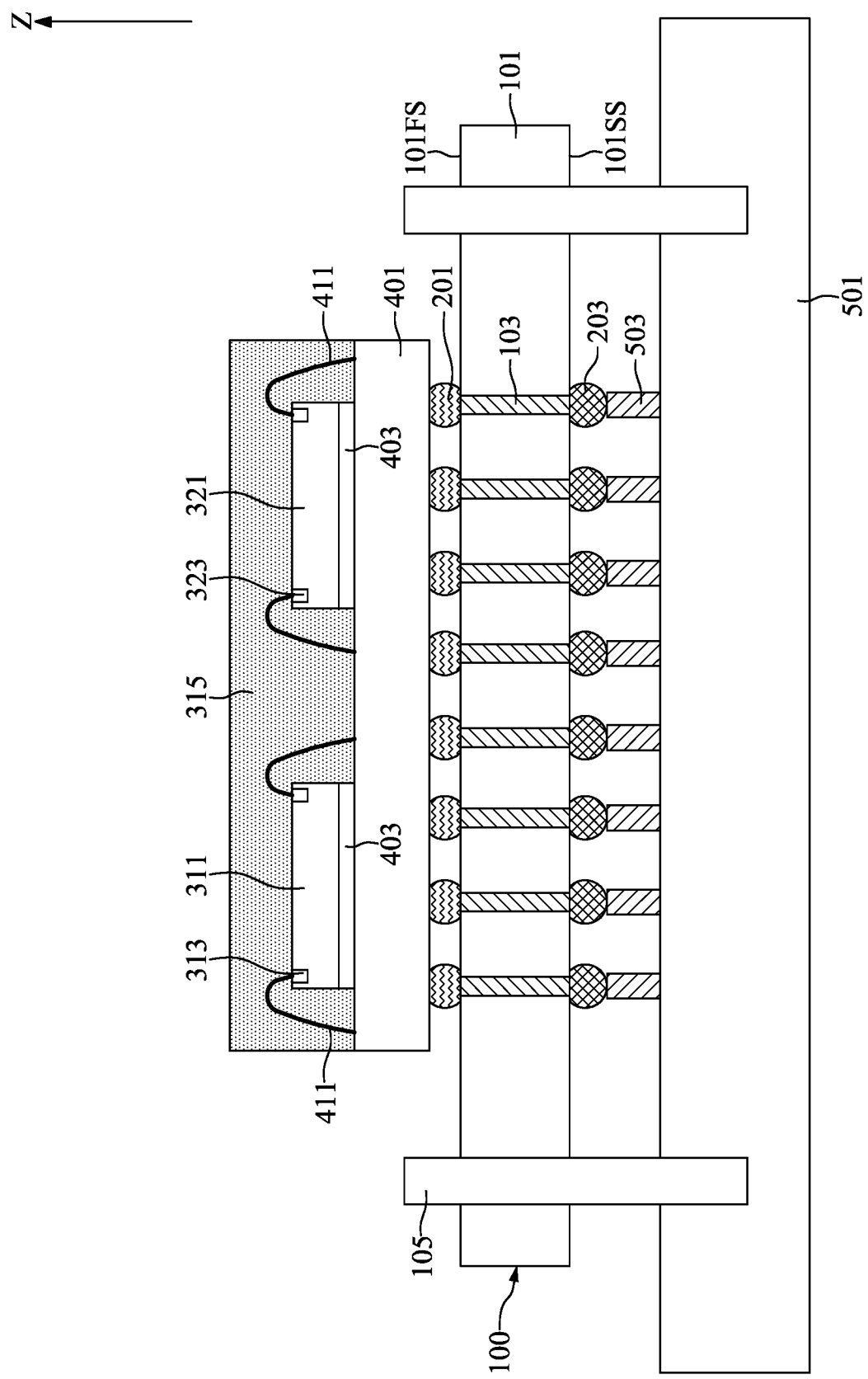
FIGS. 8 and 9 illustrate, in schematic cross-sectional view diagrams, some embodiments of the present disclosure.
Figure 9:
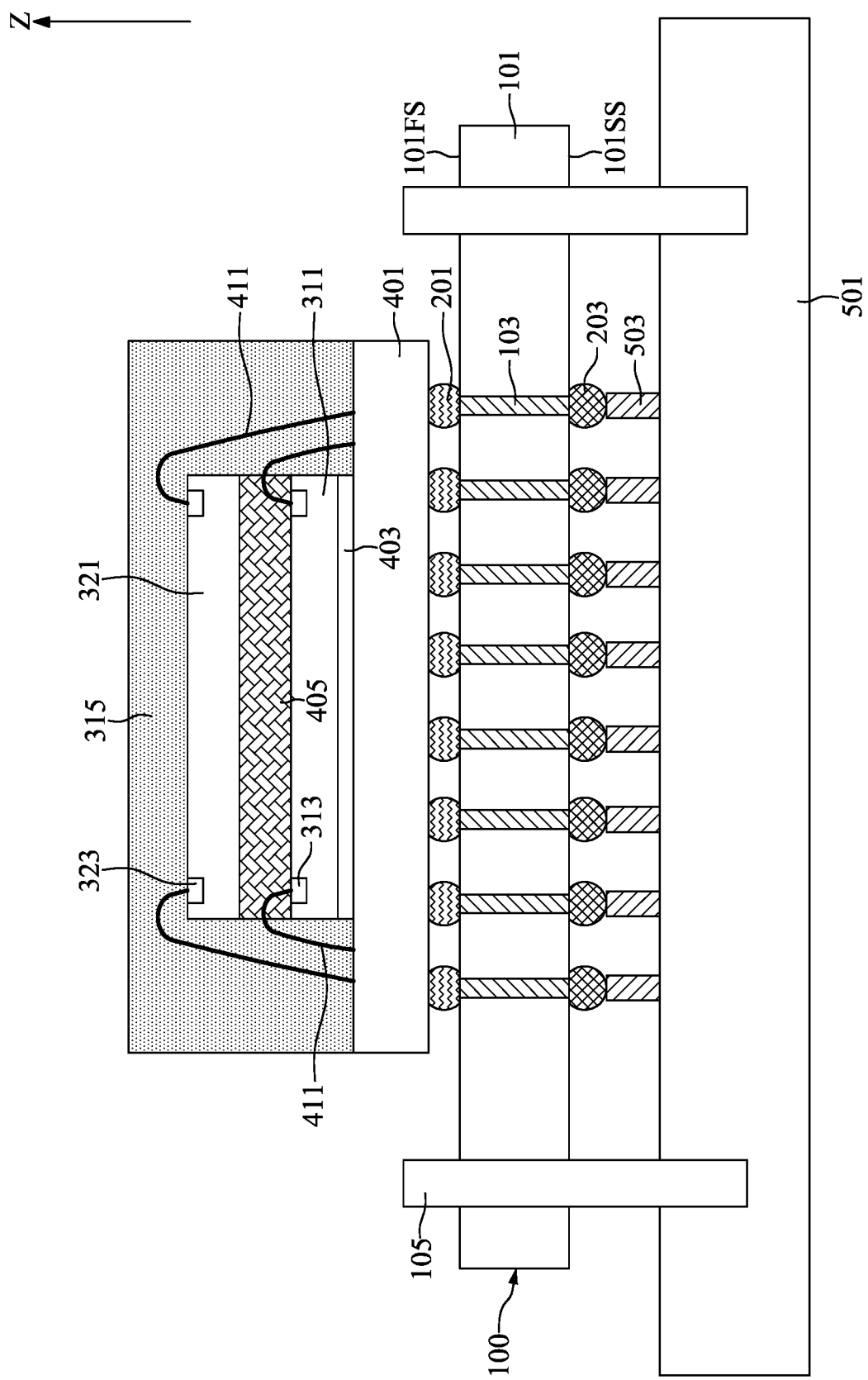

FIGS. 8 and 9 illustrate, in schematic cross-sectional view diagrams, some embodiments of the present disclosure. The same or similar elements in FIGS. 8 and 9 as in FIG. 1 have been marked with similar reference numbers and duplicative descriptions have been omitted.

With reference to FIG. 8, a second semiconductor die 321 may be disposed next to the first semiconductor die 311. The second semiconductor die 321 may be attached onto the package substrate 401 by the first attachment layer 403. A plurality of second bonding pads 323 may be disposed in the second semiconductor die 321. The top surfaces of the plurality of second bonding pads 323 may be substantially coplanar with the top surface of the second semiconductor die 321. The plurality of wires 411 may electrically couple the plurality of second bonding pads 323 to the package substrate 401. The molding layer 315 may cover the first semiconductor die 311 and the second semiconductor die 321.

In some embodiments, the second semiconductor die 321 may have a layout which is different from the layout of the first semiconductor die 311. In some embodiments, the second semiconductor die 321 may have a layout which is the same as the layout of the first semiconductor die 311. In some embodiments, the first semiconductor die 311 and the second semiconductor die 321 may provide a same functionality but are not limited thereto. In some embodiments, the second semiconductor die 321 may be bonded onto the package substrate 401 through the plurality of bumps 417 (as shown in FIG. 4). With the configuration of the present embodiment, concurrently internal probing for the first semiconductor die 311 and the second semiconductor die 321 may be conducted. Signal of the first semiconductor die 311 and the second semiconductor die 321 may be observed at same time.

With reference to FIG. 9, a second semiconductor die 321 may be disposed above the first semiconductor die 311. The second semiconductor die 321 may be attached onto the first semiconductor die 311 by a second attachment layer 405. The second attachment layer 405 may be die attach film, silver paste, or the like. In some embodiments, the second attachment layer 405 may further include gold, silver, alumina, or boron nitride particles. The plurality of wires 411 may electrically couple the plurality of second bonding pads 323 of to the package substrate 401. The molding layer 315 may cover the first semiconductor die 311 and the second semiconductor die 321.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 10:
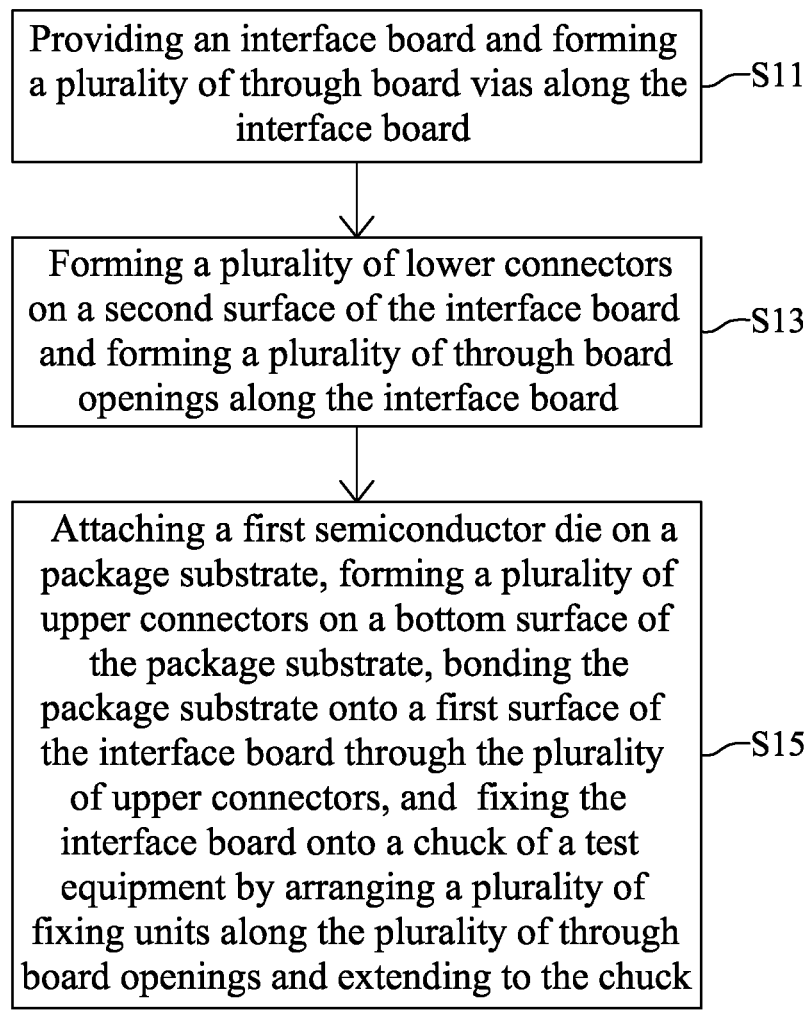
FIG. 10 illustrates, in a flowchart diagram form, a method for fabricating an interface structure with a first object in accordance with one embodiment of the present disclosure.

FIG. 10 illustrates, in a flowchart diagram form, a method 10 for fabricating an interface structure 100 with a first object in accordance with one embodiment of the present disclosure. FIGS. 11 to 15 illustrate, in schematic cross-sectional view diagrams, a flow for fabricating the interface structure 100 with the first object in accordance with one embodiment of the present disclosure.

Figure 11:
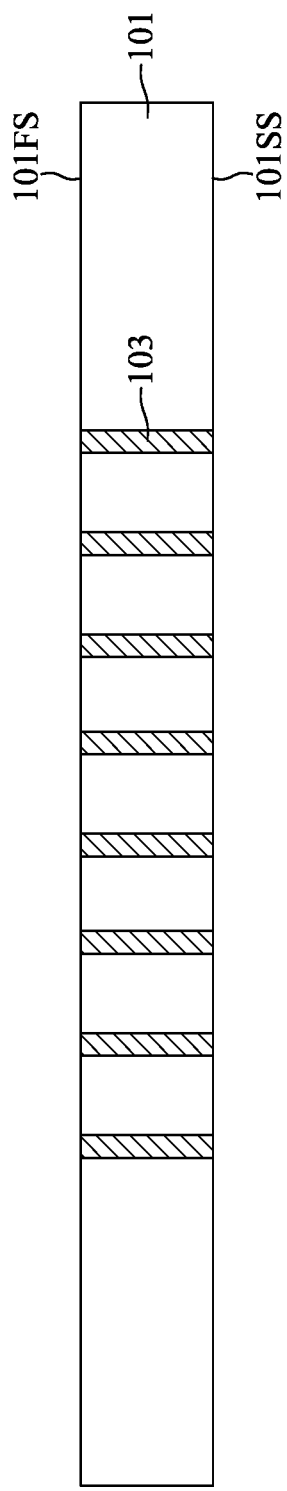
FIGS. 11 to 15 illustrate, in schematic cross-sectional view diagrams, a flow for fabricating the interface structure with the first object in accordance with one embodiment of the present disclosure.

With reference to FIGS. 10 and 11, at step S11, an interface board 101 may be provided and a plurality of through board vias 103 may be formed along the interface board 101.

With reference to FIG. 11, the interface board 101 may be a laminate sheet including an epoxy based material or bismaleimide triazine. In some embodiments, the through board via 103 may be formed by drilling the interface board 101 to form a hole and subsequently plating the hole. In some embodiments, the through board via 103 may be configured from vertically arranged micro-vias.

Figure 12:
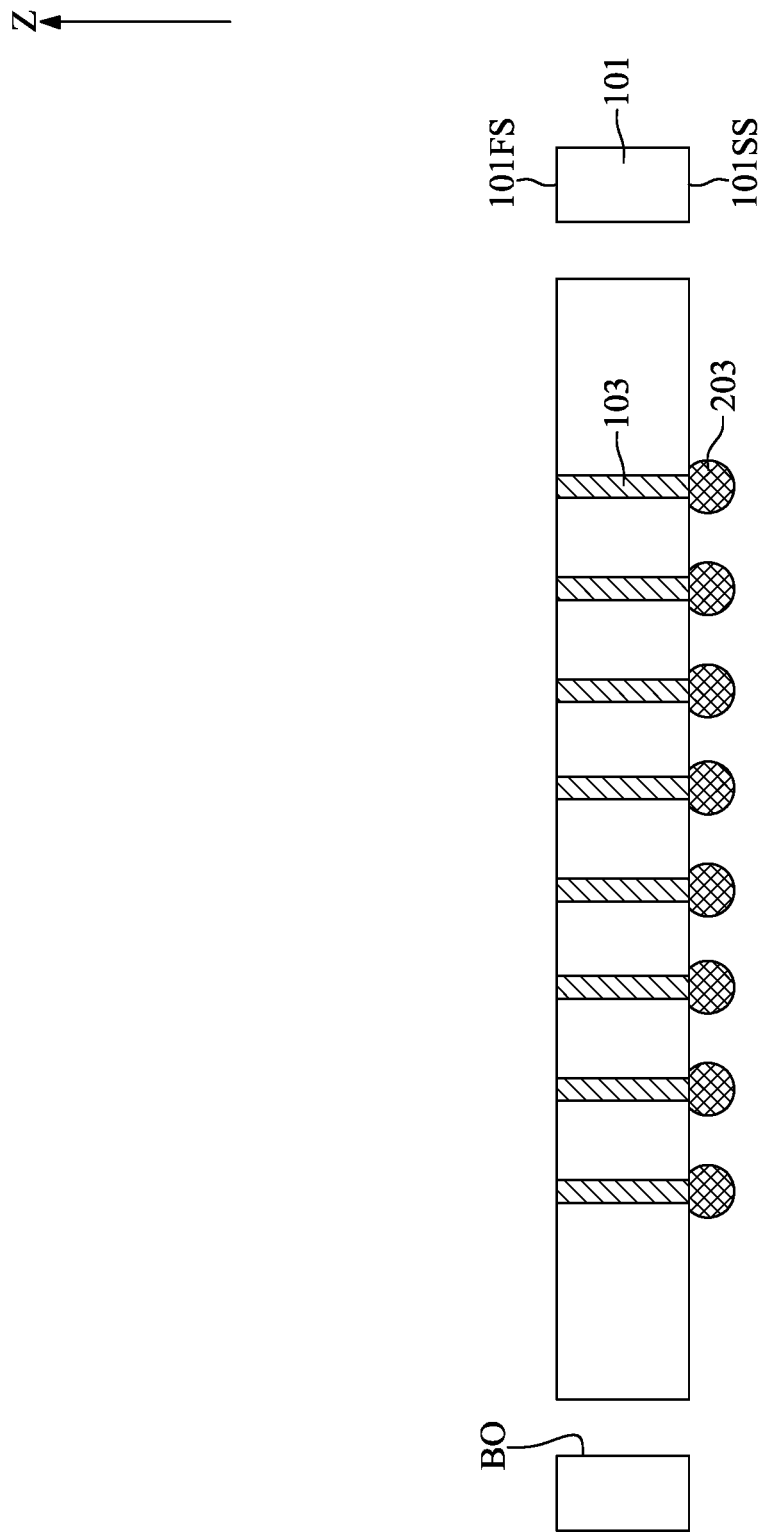

With reference to FIGS. 10 and 12, at step S13, a plurality of lower connectors 203 may be formed on a second surface 101SS of the interface board 101 and a plurality of through board openings BO may be formed along the interface board 101.

With reference to FIG. 12, the plurality of lower connectors 203 may include lead, tin, indium, bismuth, antimony, silver, gold, copper, nickel, or alloy thereof. In some embodiments, the plurality of lower connectors 203 may be tin solder balls. The tin solder balls may be formed by initially forming a layer of tin through evaporation, electroplating, printing, solder transfer, or ball placement to a thickness of about 10 μm to about 100 μm. Once the layer of tin has been formed on the second surface 101SS of the interface board 101, a reflow process may be performed to shape the layer of tin into the desired shape and form the tin solder balls. The plurality of through board openings BO may be formed by drilling through the interface board 101.

The interface board 101, the plurality of through board vias 103, and the plurality of lower connectors 203 may together configure the interface structure 100.

With reference to FIG. 10 and FIGS. 13 to 15, at step S15, a first semiconductor die 311 may be attached on a package substrate 401, a plurality of upper connectors 201 may be formed on a bottom surface of the package substrate 401, the package substrate 401 may be bonded onto a first surface 101FS of the interface board 101 through the plurality of upper connectors 201, and the interface board 101 may be fixed onto a chuck 501 of a test equipment by arranging a plurality of fixing units 105 along the plurality of through board openings BO and extending to the chuck 501.

Figure 13:
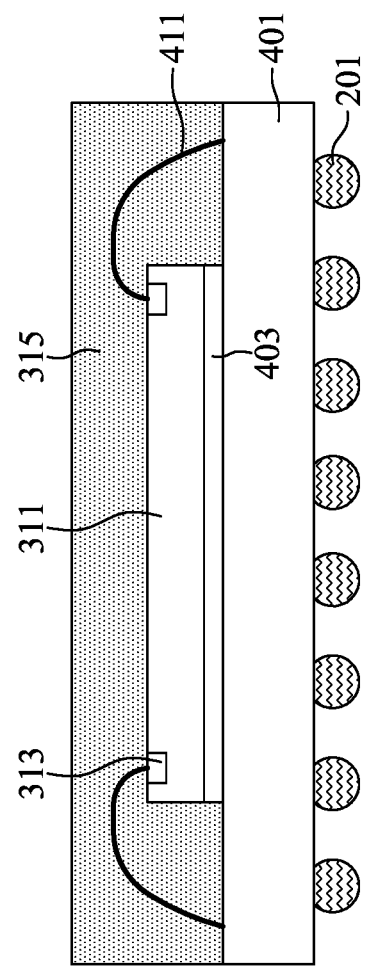

With reference to FIG. 13, the first semiconductor die 311 may be attached onto the package substrate 401 through a first attachment layer 403. Attaching the first semiconductor die 311 onto the package substrate 401 may include the following processes: an adhesive material layer may be formed below the first semiconductor die 311. The adhesive material layer may include a flowable material. The first semiconductor die 311 with the adhesive material layer may be bonded onto the package substrate 401. Thereafter, a curing process may be subsequently performed, such that the adhesive material layer may be cross-linked and cured to form the first attachment layer 403.

The package substrate 401 may be utilized to carry the first semiconductor die 311. The package substrate 401 may be electrically coupled to a plurality of first bonding pads 313 of the first semiconductor die 311 through a plurality of wires 411. The plurality of wires 411 may be formed of, for example, gold. The plurality of wires 411 may be formed through ball-wedge process or wedgewedge process by using ultrasonic bonding, thermosonic bonding, or thermocompression bonding. The first semiconductor die 311, the package substrate 401, the first attachment layer 403, and the plurality of wires 411 together configure the first object.

With reference to FIG. 13, the molding layer 315 may be formed over the package substrate 401 to cover the first semiconductor die 311 and the plurality of wires 411. The molding layer 315 may be formed of a molding compound such as polybenzoxazole, polyimide, benzocyclobutene, epoxy laminate, or ammonium bifluoride. The molding layer 315 may be formed by compressive molding, transfer molding, liquid encapsulant molding, and the like. For example, a molding compound may be dispensed in liquid form. Subsequently, a curing process is performed to solidify the molding compound. The formation of molding compound may overflow the first semiconductor die 311 so that molding compound covers the first semiconductor die 311. A planarization process such as mechanical grinding, chemical mechanical polish, or other etch back technique may be employed to remove excess portions of the molding compound and provide a substantially flat surface.

With reference to FIG. 13, the plurality of upper connectors 201 may include lead, tin, indium, bismuth, antimony, silver, gold, copper, nickel, or alloy thereof. In some embodiments, the plurality of upper connectors 201 may be tin solder balls. The tin solder balls may be formed by initially forming a layer of tin through evaporation, electroplating, printing, solder transfer, or ball placement to a thickness of about 10 µm to about 100 µm. Once the layer of tin has been formed on the bottom surface of the package substrate 401, a reflow process may be performed to shape the layer of tin into the desired shape and form the tin solder balls.

In some embodiments, the plurality of upper connectors 201 may be formed on the first surface 101FS of the interface board 101 concurrently with the plurality of lower connectors 203. In some embodiments, the interface structure 100 may include the plurality of upper connectors 201.

Figure 14:
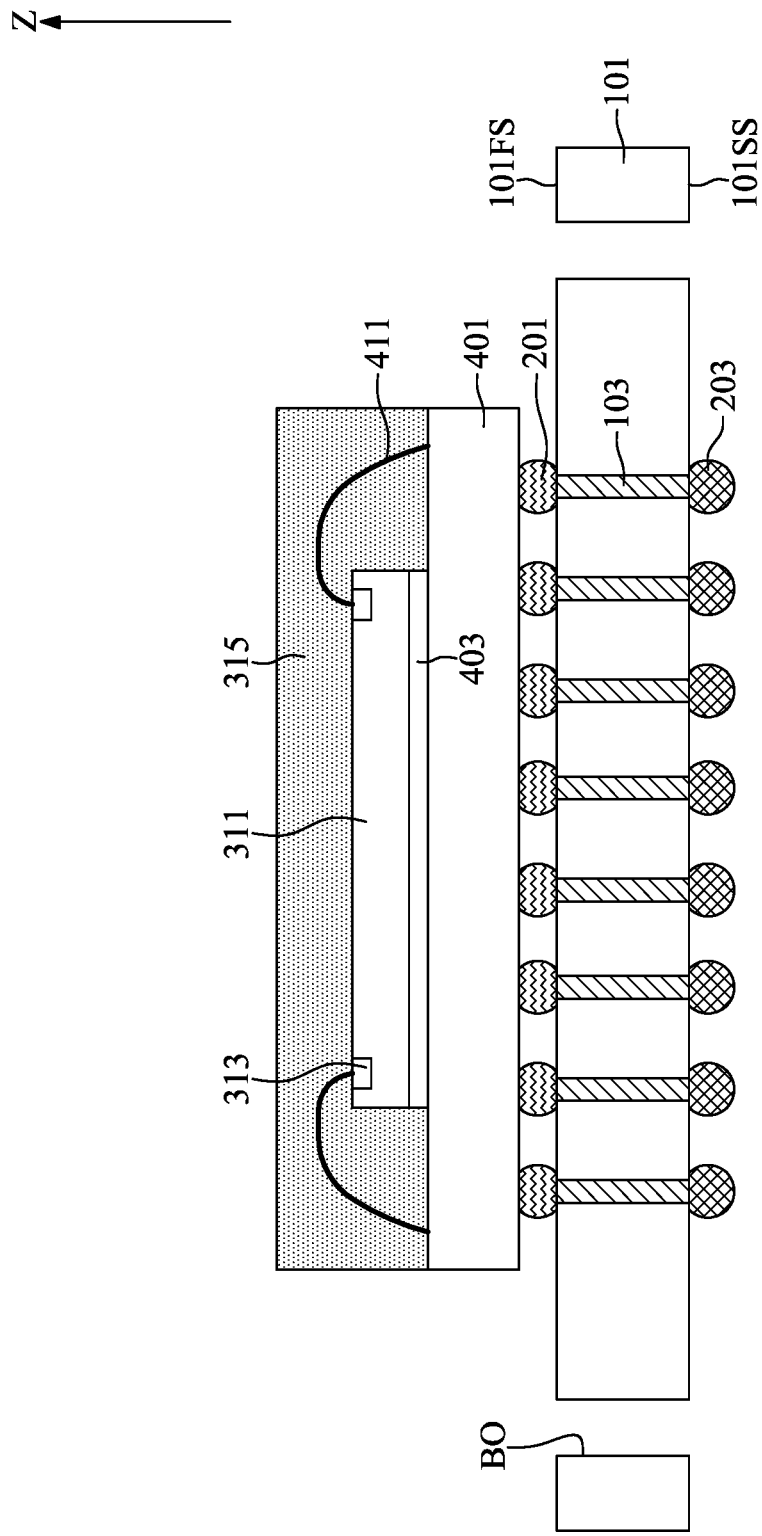

With reference to FIG. 14, the package substrate 401 may be bonded onto the first surface 101FS of the interface board 101. A reflow process may be applied.

Figure 15:
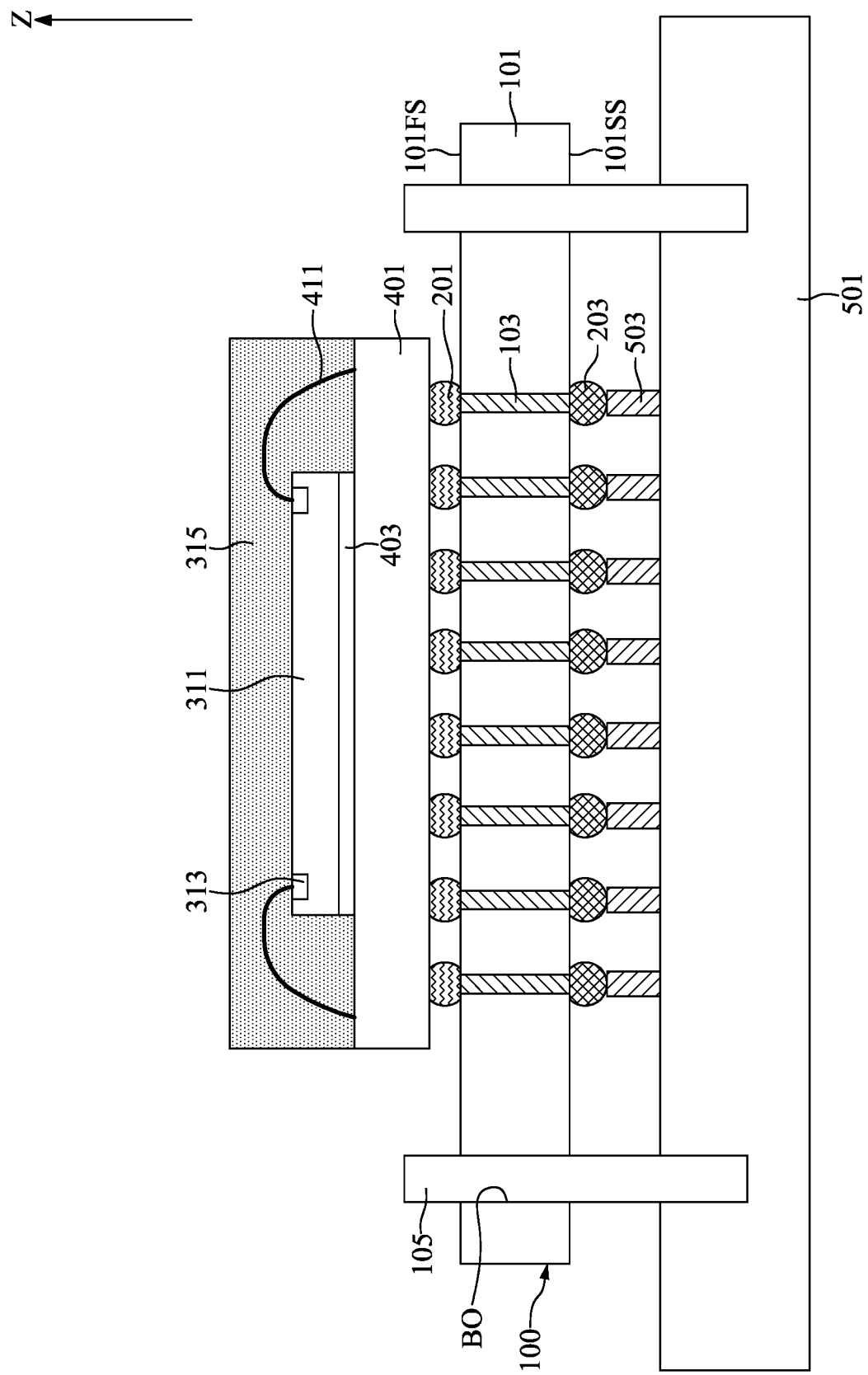

With reference to FIG. 15, the plurality of fixing units 105 may be vertically arranged into the plurality of through board openings BO, respectively. The plurality of fixing units 105 may extend into the chuck 501 of the test equipment to make the plurality of lower connectors 203 contact a plurality of chuck connectors 503 of the test equipment.

The position of the plurality of fixing units 105 may be adjusted to determine the contact stress between the plurality of lower connectors 203 and the plurality of chuck connectors 503. During analysis of the first semiconductor die 311, the molding layer 315 may be removed. Probes of a probe card may be directly contact the top surface of the first semiconductor die 311 to detect internal signal of the first semiconductor die 311.

One aspect of the present disclosure provides an interface structure including an interface board configured to be fixed onto and electrically coupled to a chuck of a testing equipment, and a first object positioned on a first surface of the interface board and electrically coupled to the interface board. The first object is configured to be analyzed by the testing equipment.

Another aspect of the present disclosure provides an interface structure including an interface board configured to fix onto and electrically coupled to a chuck of a testing equipment, an upper connector positioned on a first surface and electrically coupled to the interface board, a lower connector positioned on a second surface and electrically coupled to the interface board, and a through board via positioned in the interface board and configured to electrically couple the upper connector and the lower connector. The first surface of the interface board is opposite to the second surface of the interface board.

Another aspect of the present disclosure provides a method for fabricating an interface structure including providing an interface board, forming a through board via along the interface board, forming a through board opening along the interface board, forming an upper connector on a first surface of the interface board, and forming a lower connector on a second surface of the interface board.

Due to the design of the interface structure 100 of the present disclosure, the internal signal of the first semiconductor die 311 may be detected and failure mode and effects analysis in high frequency can be conducted.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

an interface board configured for fixing onto and electrically coupling to a chuck of a testing equipment, wherein the interface board has a first surface and a second surface opposite to the first surface, wherein the interface board further has at least a through hole straightly extended between the first surface and the second surface to form at least a straight slot;

an upper connector positioned on the first surface of the interface board and electrically coupled to the interface board;

a lower connector positioned on the second surface of the interface board and electrically coupled to the interface board;

at least a through board via positioned in the interface board at said through hole thereof to form a vertically arranged micro-via, wherein the through board via has a top end electrically coupling to the upper connector and a lower end electrically coupling to the lower connector, wherein the upper connector is coaxially aligned with the lower connector when the upper connector and the lower connector are coupled to the top end and the lower end of the through board via respectively, wherein a height of the through board via equal to a thickness of the interface board;

at least a first board pad positioned between the first surface of the interface board and the upper connector and directly contacted among the first surface of the interface board, the top end of the through board via, and the upper connector to electrically coupling the first end of the through board via to the upper connector, wherein a width of the first board pad is larger than a width of the through board via; and at least a second board pad positioned between the second surface of the interface board and the lower connector and directly contacted among the second surface of the interface board, the lower end of the through board via, and the lower connector to electrically coupling the second end of the through board via to the lower connector, such that the first board pad is coaxially aligned with the second board pad, wherein a width of the second board pad is larger than the width of the through board via;

a first resist layer having a first flat bottom surface disposed on the first surface of the interface board and a first flat top surface to define a uniform thickness of a first resist layer between the first flat top surface and the first flat bottom surface, wherein the first resist layer has at least a first through opening formed extended from the first flat top surface to the first flat bottom surface to receive the first board pad thereat, wherein a depth of the first through opening is larger than a thickness of the first board pad, wherein when the first board pad is disposed in the first through opening, a first recess is formed and indented on the first flat top surface of the first resist layer to receive a lower portion of the upper connector therein, such that the lower portion of the upper connector is embedded below the first flat top surface of the first resist layer; and a second resist layer having a second flat top surface disposed on the second surface of the interface board and a second flat bottom surface to define a uniform thickness of the second resist layer between the second flat top surface and the second flat bottom surface, wherein the second resist layer has at least a second through opening extended from the second flat top surface to the second flat bottom surface to receive the second board pad thereat, wherein a depth of the second through opening is larger than a thickness of the second board pad, wherein when the second board pad is disposed in the second through opening, a second recess is formed and indented on the second flat bottom surface of the first resist layer to receive an upper portion of the lower connector therein, such that the upper portion of the lower connector is embedded into the second flat bottom surface of the second resist layer.

2. The semiconductor device of claim 1, wherein each of the first resist layer and the second resist layer is selected from a group of polybenzoxazole, polyimide, benzocyclobutene, epoxy laminate, and ammonium bifluoride.

3. The semiconductor device of claim 2, wherein the first through opening has an upper portion extended to the first flat top surface of the first resist layer to define the first recess and a lower portion extended to the first flat bottom surface of the first resist layer, wherein a size of the upper portion of the first through opening is smaller than a size of the lower portion of the first through opening, wherein the lower portion of the upper connector is received in the upper portion of the first through opening, wherein the first board pad is received in the lower portion of the first through opening, wherein the size of the upper portion of the first through opening is smaller than a size of the first board pad to cover a peripheral of the first board pad and to allow the first board pad being directly contacted between the top end of the through board via and the upper connector, wherein the second through opening has an upper portion extended to the second flat top surface of the second resist layer and a lower portion extended to the second flat bottom surface of the second resist layer to define the second recess, wherein a size of the upper portion of the second through opening is larger than a size of the lower portion of the second through opening, wherein the upper portion of the lower connector is received in the lower portion of the second through opening, wherein the second board pad is received in the upper portion of the second through opening, wherein the size of the lower portion of the second through opening is smaller than a size of the second board pad to cover a peripheral of the second board pad and to allow the second board pad being directly contacted between the lower end of the through board via and the lower connector.

4. The semiconductor device of claim 3, further comprising:

a first object comprising a first semiconductor die and a package substrate positioned on the upper connector and electrically coupled to the upper connector, wherein a thickness of the package substrate is less than a thickness of the interface board; and at least a ball pad disposed and directly contacted between a bottom surface of the package substrate and the upper connector to electrically couple the package substrate to the upper connector, wherein a width of the ball pad is larger than the width of the through board via, wherein the first board pad, the second board pad and the ball pad have the same width.

5. The semiconductor device of claim 4, further comprising a third resist layer which has a third flat top surface disposed on the bottom surface of the package substrate and a third flat bottom surface to define a uniform thickness of the third resist layer between the third flat top surface and the third flat bottom surface, wherein the third resist layer has at least a third through opening formed extended from the third flat top surface to the third flat bottom surface to receive the ball pad thereat, wherein a depth of the third through opening is larger than a thickness of the ball pad, wherein when the ball pad is disposed in the third through opening, a third recess is formed and indented on the third flat bottom surface of the third resist layer to receive an upper portion of the upper connector therein, such that the upper portion of the upper connector is embedded into the third flat bottom surface of the third resist layer.

6. The semiconductor device of claim 5, wherein a size of the upper portion of the third through opening is larger than a size of the lower portion of the third through opening, wherein the upper portion of the upper connector is received in the lower portion of the third through opening, wherein the ball pad is received in the upper portion of the third through opening, wherein the size of the lower portion of the third through opening is smaller than a size of the ball pad to cover a peripheral of the ball pad and to allow the ball pad being directly contacted between the bottom surface of the package substrate and the upper connector.

7. The semiconductor device of claim 6, wherein each of the first, second and third resist layers is selected from a group consisting of polybenzoxazole, polyimide, benzocyclobutene, epoxy laminate, and ammonium bifluoride.

8. The semiconductor device of claim 5, further comprising at least a chuck connector which comprises:
   a top connection pin configured to contact with the lower connector;
   a bottom connection pin configured for contacting with the chuck of the testing equipment; and
   a resilient connecting unit provided between the top connection pin and the bottom connection pin for absorbing a shock between the interface board and the chuck of the testing equipment and for ensuring the top connection pin and the bottom connection pin contacting with the lower connector and the chuck of the testing equipment respectively, wherein the top connection pin, the bottom connection pin, and the resilient connecting unit are aligned with the through board via, the upper connector, and the lower connector;
   wherein the first object further comprises:
      a first attachment layer interposed between the package substrate and the first semiconductor die;
      a plurality of first bonding pads disposed in a circuit layer of the first semiconductor die;
      a plurality of wires electrically connecting the plurality of first bonding pads to the package substrate; and
      a molding layer disposed on the package substrate to cover the first semiconductor die, the plurality of the first bonding pads, the first attachment layer, and the plurality of wires.

9. A method for fabricating an interface structure, comprising the steps of:
   providing an interface board configured for fixing onto and electrically coupling to a chuck of a testing equipment, wherein the interface board has a first surface and a second surface opposite to the first surface, wherein the interface board further has at least a through hole straightly extended between the first surface and the second surface to form at least a straight slot;
   providing an upper connector on the first surface of the interface board and electrically coupling to the interface board;
   providing a lower connector on the second surface of the interface board and electrically coupling to the interface board;
   forming at least a through board via in the interface board at said through hole thereof to form a vertically arranged micro-vias, wherein the through board via has a top end electrically coupling to the upper connector and a lower end electrically coupling to the lower connector, wherein the upper connector is coaxially aligned with the lower connector when the upper connector and the lower connector are coupled to the top end and the lower end of the through board via respectively;
   forming at least a first board pad between the first surface of the interface board and the upper connector at a position that the first board pad is directly contacted among the first surface of the interface board, the top end of the through board via, and the upper connector to electrically coupling the first end of the through board via to the upper connector, wherein a width of the first board pad is larger than a width of the through board via;
   forming at least a second board pad between the second surface of the interface board and the lower connector at a position that the second board pad is directly contacted among the second surface of the interface board, the lower end of the through board via, and the lower connector to electrically coupling the second end of the through board via to the lower connector, such that the first board pad is coaxially aligned with the second board pad, wherein a width of the second board pad is larger than the width of the through board via;
   disposing a first resist layer on the interface board by disposing a first flat bottom surface of the first resist layer on the first surface of the interface board and having a first flat top surface of the first resist layer to define a uniform thickness of the first resist layer between the first flat top surface and the first flat bottom surface, wherein the first resist layer has at least a first through opening formed extended from the first flat top surface to the first flat bottom surface to receive the first board pad thereat, wherein a depth of the first through opening is larger than a thickness of the first board pad, wherein when the first board pad is disposed in the first through opening, a first recess is formed and indented on the first flat top surface of the first resist layer to receive a lower portion of the upper connector therein, such that the lower portion of the upper connector is embedded below the first flat top surface of the first resist layer; and
   disposing a second resist layer on the interface board by disposing a second flat top surface of the second resist layer on the second surface of the interface board and having a second flat bottom surface of the second resist layer to define a uniform thickness of the second resist layer between the second flat top surface and the second flat bottom surface, wherein the second resist layer has at least a second through opening extended from the second flat top surface to the second flat bottom surface to receive the second board pad thereat, wherein a depth of the second through opening is larger than a thickness of the second board pad, wherein when the second board pad is disposed in the second through opening, a second recess is formed and indented on the second flat bottom surface of the first resist layer to receive an upper portion of the lower connector therein, such that the upper portion of the lower connector is embedded into the second flat bottom surface of the second resist layer.

10. The method of claim 9, wherein each of the first resist layer and the second resist layer is selected from a group of polybenzoxazole, polyimide, benzocyclobutene, epoxy laminate, and ammonium bifluoride.

11. The method of claim 10, wherein the first through opening has an upper portion extended to the first flat top surface of the first resist layer to define the first recess and a lower portion extended to the first flat bottom surface of the first resist layer, wherein a size of the upper portion of the first through opening is smaller than a size of the lower portion of the first through opening, wherein the lower portion of the upper connector is received in the upper portion of the first through opening, wherein the first board pad is received in the lower portion of the first through opening, wherein the size of the upper portion of the first through opening is smaller than a size of the first board pad to cover a peripheral of the first board pad and to allow the first board pad being directly contacted between the top end of the through board via and the upper connector, wherein the second through opening has an upper portion extended to the second flat top surface of the second resist layer and a lower portion extended to the second flat bottom surface of the second resist layer to define the second recess, wherein a size of the upper portion of the second through opening is larger than a size of the lower portion of the second through opening, wherein the upper portion of the lower connector is received in the lower portion of the second through opening, wherein the second board pad is received in the upper portion of the second through opening, wherein the size of the lower portion of the second through opening is smaller than a size of the second board pad to cover a peripheral of the second board pad and to allow the second board pad being directly contacted between the lower end of the through board via and the lower connector.

12. The method of claim 11, further comprising the steps of:
coupling a first object to the interface board, wherein the first object comprises a first semiconductor die and a package substrate positioned on the upper connector and electrically coupled to the upper connector, wherein a thickness of the package substrate is less than a thickness of the interface board; and
directly contacting at least a ball pad between a bottom surface of the package substrate and the upper connector to electrically couple the package substrate to the upper connector, wherein a width of the ball pad is larger than the width of the through board via, wherein the first board pad, the second board pad and the ball pad have the same width.

13. The method of claim 12, further comprising a step of disposing a third resist layer on the bottom surface of the package substrate, wherein the third resist layer has a third flat top surface disposed on the bottom surface of the package substrate and a third flat bottom surface to define a uniform thickness of the third resist layer between the third flat top surface and the third flat bottom surface, wherein the third resist layer has at least a third through opening formed extended from the third flat top surface to the third flat bottom surface to receive the ball pad thereat, wherein a depth of the third through opening is larger than a thickness of the ball pad, wherein when the ball pad is disposed in the third through opening, a third recess is formed and indented on the third flat bottom surface of the third resist layer to receive an upper portion of the upper connector therein, such that the upper portion of the upper connector is embedded into the third flat bottom surface of the third resist layer.

14. The method of claim 13, wherein a size of the upper portion of the third through opening is larger than a size of the lower portion of the third through opening, wherein the upper portion of the upper connector is received in the lower portion of the third through opening, wherein the ball pad is received in the upper portion of the third through opening, wherein the size of the lower portion of the third through opening is smaller than a size of the ball pad to cover a peripheral of the ball pad and to allow the ball pad being directly contacted between the bottom surface of the package substrate and the upper connector.

15. The method of claim 14, wherein each of the first, second and third resist layers is selected from a group consisting of polybenzoxazole, polyimide, benzocyclobutene, epoxy laminate, and ammonium bifluoride.

16. The method of claim 15, further comprising a step of providing at least a chuck connector for coupling the interface board at the chuck of the testing equipment by the steps of:
contacting a top connection pin of the chuck connector with the lower connector;
contacting a bottom connection pin of the chuck connector with the chuck of the testing equipment; and
providing a resilient connecting unit of the chuck connector between the top connection pin and the bottom connection pin for absorbing a shock between the interface board and the chuck of the testing equipment and for ensuring the top connection pin and the bottom connection pin contacting with the lower connector and the chuck of the testing equipment respectively, wherein the top connection pin, the bottom connection pin, and the resilient connecting unit are aligned with the through board via, the upper connector, and the lower connector;
wherein the first object is formed by:
interposing a first attachment layer between the package substrate and the first semiconductor die;
disposing a plurality of first bonding pads in a circuit layer of the first semiconductor die;
electrically connecting the plurality of first bonding pads to the package substrate by a plurality of wires; and
disposing a molding layer on the package substrate to cover the first semiconductor die, the plurality of first bonding pads, the first attachment layer, and the plurality of wires.

\* \* \* \* \*